US008400739B2

(12) United States Patent
Ioannidis et al.

(10) Patent No.: US 8,400,739 B2
(45) Date of Patent: Mar. 19, 2013

(54) SYSTEM AND METHOD FOR OPERATING INVERTERS

(75) Inventors: Dimitrios Ioannidis, Erie, PA (US); Bojan Djokanovic, Erie, PA (US)

(73) Assignee: General Electric Company, Schenectady, NY (US)

( * ) Notice: Subject to any disclaimer, the term of this patent is extended or adjusted under 35 U.S.C. 154(b) by 205 days.

(21) Appl. No.: 13/037,175

(22) Filed: Feb. 28, 2011

(65) Prior Publication Data
US 2012/0218669 A1    Aug. 30, 2012

(51) Int. Cl.
*H02H 5/04* (2006.01)
(52) U.S. Cl. .......................... 361/18; 361/23
(58) Field of Classification Search .............. 361/18, 361/23, 31, 33
See application file for complete search history.

(56) References Cited

U.S. PATENT DOCUMENTS

| 4,484,127 A * | 11/1984 | Salihi et al. .................. 318/802 |
| 2005/0281065 A1 * | 12/2005 | Nojima ........................ 363/98 |
| 2011/0140727 A1 * | 6/2011 | Soldi et al. ............... 324/762.01 |

* cited by examiner

*Primary Examiner* — Danny Nguyen
(74) *Attorney, Agent, or Firm* — GE Global Patent Operation; John A. Kramer

(57) ABSTRACT

There is provided a control system and method related to the use of insulated gate bipolar transistor (IGBT) devices in vehicles. An exemplary control method includes receiving a status signal that indicates a fault condition in the operation of an IGBT device of an affected converter. The exemplary method also includes sending a control signal that turns off all IGBTs of the affected converter. The exemplary method additionally includes receiving a second status signal for each of the IGBTs that indicates whether each of the IGBTs successfully turned off. The exemplary method further includes generating an indication that the fault condition relates to a saturation condition or a power supply being outside a designated range, depending on a duration of the fault signal.

20 Claims, 18 Drawing Sheets

200

300

500

600

800

900

1300

1600

SYSTEM AND METHOD FOR OPERATING INVERTERS

BACKGROUND

Exemplary embodiments of the invention relate generally to a system and method for improving the power handling capabilities of an electronic device, such as insulated gate bipolar transistor (IGBT) inverters. Moreover, such exemplary embodiments may relate to modeling, monitoring, and reducing the temperature of IGBT inverters.

Traction vehicles such as, for example, locomotives, employ electric traction motors for driving wheels of the vehicles. In some of these vehicles, the motors are alternating current (AC) motors whose speed and power are controlled by varying the frequency and the voltage of AC electric power supplied to the field windings of the motors. Commonly, the electric power is supplied at some point in the vehicle system as DC power and is thereafter converted to AC power of controlled frequency and voltage amplitude by a circuit such an inverter, which includes a set of switches such as IGBTs. In some systems, the electric power may be derived from a bank of electrical batteries coupled to a leg of the inverter.

In operation, IGBT inverters may experience an out-of-saturation operation, in which the IGBT inverter is in, or just turned to, an "on" state while an associated compliment module (for example, an IGBT, diode or bus bar) or the load have failed and represent a short circuit. Further, IGBT inverters may experience a low voltage power supply out of range condition.

Known methods of addressing out-of-saturation conditions include inserting a relatively large resistance in series with an external resistor Rg. In these methods, the rate of reduction of the current is very slow. Thus, if the device restricts the short circuit current to a first level, during the "soft switching off" provided by the added resistance, the first level may not decline to an acceptable level. The timing of the current reduction may also need to be controlled in a relatively precise manner do prevent damage to the IGBT device Improved systems and methods of detecting these conditions and responding to them are desirable.

SUMMARY

Briefly, in accordance with an exemplary embodiment, there is provided a control system and method related to the use of insulated gate bipolar transistor (IGBT) devices in vehicles. An exemplary control method includes receiving a status signal that indicates a fault condition in the operation of an IGBT device of an affected converter. An "affected" converter is a converter having an IGBT device in regards to which a status signal, indicating a fault condition, has been generated. The exemplary method also includes sending a control signal that turns off all IGBTs of the affected converter. The exemplary method additionally includes receiving a second status signal for each of the IGBTs that indicates whether each of the IGBTs successfully turned off. The exemplary method further includes generating an indication that the fault condition relates to a saturation condition or a power supply being outside a designated range, depending on a duration of the fault signal.

One embodiment relates to an inverter system. An exemplary inverter system comprises an insulated gate bipolar transistor (IGBT) of an affected converter. The exemplary inverter system also comprises a controller that receives a status signal that indicates a fault condition in the operation of the IGBT of the affected converter. The controller sends a control signal that turns off all IGBTs of the affected converter. The controller receives a second status signal that indicates whether the IGBTs of the affected converter successfully turned off. The controller also generates an indication that the fault condition relates to a saturation condition or a power supply being outside a designated range, depending on a duration of the fault signal.

Yet another embodiment relates to a power system for a vehicle. An exemplary power system includes an insulated gate bipolar transistor (IGBT) converter that comprises a plurality of IGBTs. A plurality of electronic devices is powered by the IGBTs. The exemplary power system also includes a controller that receives a status signal that indicates a fault condition in the operation of a one of the IGBTs of the IGBT converter. The controller sends a control signal that turns off all IGBTs of the IGBT controller. The controller receives a second status signal that indicates whether each of the IGBTs successfully turned off. In addition, the controller generates an indication that the fault condition relates to a saturation condition or a power supply being outside a designated range, depending on a duration of the fault signal.

DRAWINGS

These and other features, aspects, and advantages of the invention will become better understood when the following detailed description is read with reference to the accompanying drawings in which like characters represent like parts throughout the drawings, wherein.

DETAILED DESCRIPTION

Figure 1:
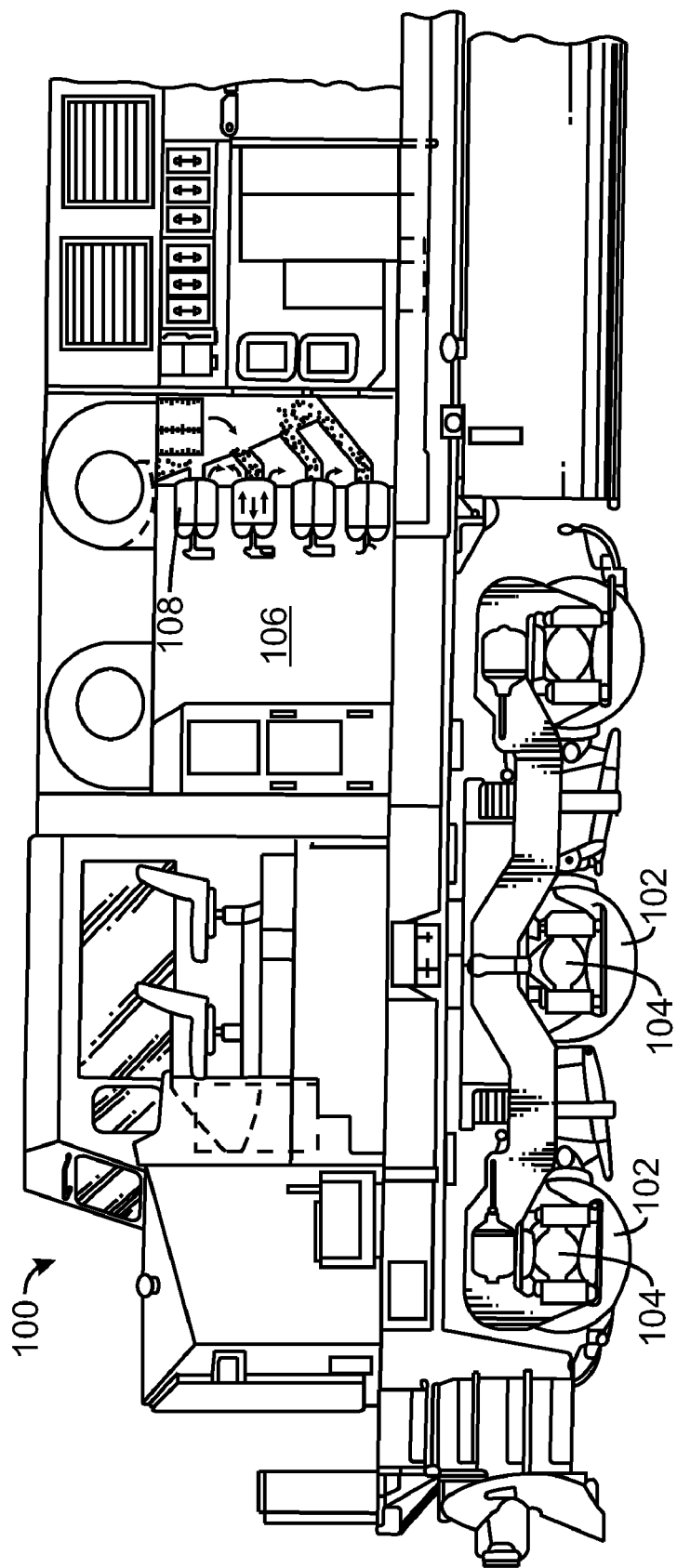
FIG. 1 is a block diagram of a diesel-electric locomotive that may employ an inverter control circuit according to an exemplary embodiment.

FIG. 1 is a block diagram of a diesel-electric locomotive that may employ an inverter control circuit according to an exemplary embodiment. The locomotive, which is shown in a simplified, partial cross-sectional view, is generally referred to by the reference number 100. A plurality of traction motors, not visible in FIG. 1, are located behind drive wheels 102 and coupled in a driving relationship to axles 104. A plurality of auxiliary motors, not visible in FIG. 1, are located in various locations on the locomotive, and coupled with various auxiliary loads like blowers or radiator fans. The motors may be alternating current (AC) electric motors. As explained in detail below, the locomotive 100 may include a plurality of electrical inverter circuits for controlling electrical power to the motors.

Figure 2:
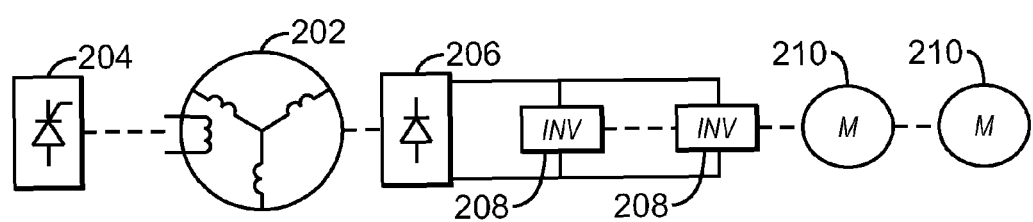
FIG. 2 is a block diagram of a power system according to an exemplary embodiment.

FIG. 2 is a block diagram of a power system according to an exemplary embodiment of the invention. The power system, which is generally referred to by the reference number 200, may be used to control AC power to an Off Highway Vehicle, although in a locomotive 100 shown in FIG. 1 application 4-6 AC electric motors are employed, each controlled by an individual Inverter. The power system 200 includes an alternator 202 driven by an on-board internal combustion engine such as a diesel engine (not shown). The power output of the alternator 202 is regulated by field excitation control indicated by a field control 204. Electrical power from alternator 202 is rectified by a rectifier 206, and coupled to one or more inverters 208. The inverters 208 may use high power IGBTs to convert the DC power to AC power, variable frequency, and/or variable voltage amplitude for application to one or more AC motors 210.

Referring again to FIG. 1, electrical power circuits are at least partially located in an equipment compartment 106. The control electronics for the inverters 208 and the field control 204 as well as other electronic components may be disposed on circuit boards held in racks in the equipment compartment 106. Within the equipment compartment 106, the high power IGBT semiconductor devices used in the power conversion may be mounted to air-cooled heat sinks 108.

Figure 3:
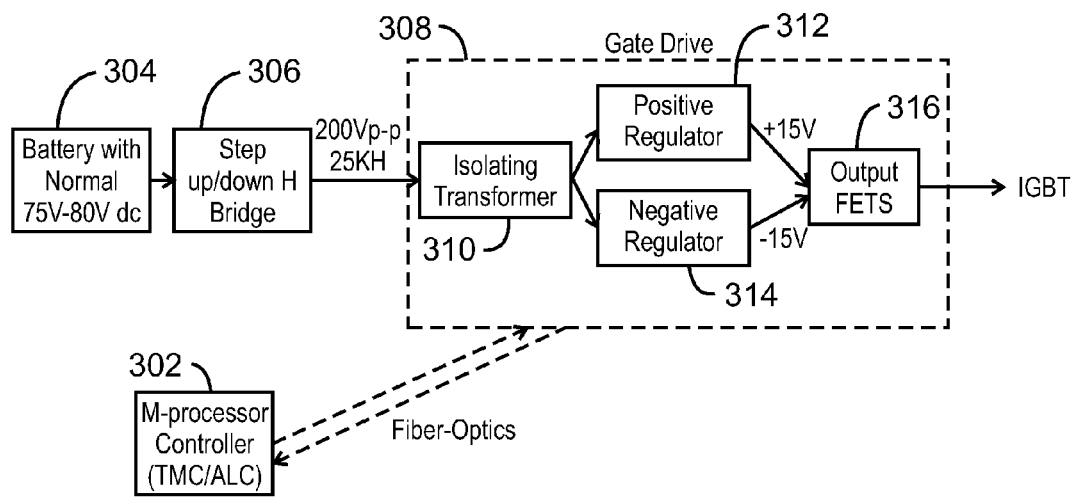
FIG. 3 is a block diagram of a control system for IGBT inverters according to an exemplary embodiment.

FIG. 3 is a block diagram of a control system 300 for IGBT inverters according to an exemplary embodiment. The control system 300 includes a processor controller 302, which may be connected to the remainder of the controls system 300 via a fiber-optic communication link. A battery 304 delivers power to a step-up/down H bridge 306. As shown in FIG. 3, the battery may have a nominal output of 75-80 volts dc. The step-up/down H bridge 306 provides an output of 200 v p-p at 25 KHz to a gate drive 308, indicated with dashed lines in FIG. 3. The gate drive 308 may be used to drive IGBTs in, by way of example, traction inverters, auxiliary inverters or double H bridge converters.

The gate drive 308 includes an isolating transformer 310, which receives the output from the step-up/down H bridge 306. The isolating transformer 310 delivers output to a positive regulator 312 and a negative regulator 314. The positive regulator 312 and the negative regulator 314 deliver their output of 15 v and −15 volts respectively to a plurality of output FETs 316. The output FETs 316 are used to drive IGBT inverters, as described herein.

As explained herein, an exemplary embodiment relates to detecting an addressing various conditions of IGBT inverters. One such condition is an out-of-saturation operation of an IGBT inverter. When an out-of-saturation operating condition is detected, a process of communicating the fault to a logic card (for example, as shown in FIG. 3) is performed and a sequence of actions is taken to protect the affected IGBT inverters from damage.

Another condition that may be detected and addressed according to an exemplary embodiment is a low voltage supply out of range condition. The gate drive 308 may detect this condition and undertake a course of action to protect the associated IGBT inverters. Moreover, exemplary embodiments may be employed in a wide range of applications, including locomotives, off-highway vehicles, marine systems or wind systems.

In a typical power system, a positive level of Vge, provided to the IGBT is greater than 14 volts to provide proper IGBT on-state voltage. The voltage should typically be below 16.5 volts to provide short circuit capability at 1800 VDC. This translated to the output of the regulator means that the positive supply voltage should be between 12.5 volts and 16.5 volts. The gate drive 308 detects supply voltage out of this range. In the event of an out-of-saturation operation or a low voltage supply out of range condition, the gate drive 308 operates to switch off the IGBT inverters in a controlled manner to protect them from failing.

In the exemplary embodiment shown in FIG. 3, the fiber-optic link between the processor controller 302 and the gate drive 308 is independent of a firing command link. Instead, the fiber-optic link is used to provide status information from the gate drive 308 to a logic card that hosts the processor controller 302. (Traction Motor Control-TMC or Auxiliary Logic Control-ALC). This status feedback may include the following:

1. IGBT is turning ON.
2. IGBT is turning OFF.
3. The gate drive performed an out-of-saturation protection.
4. The gate drive performed a low voltage power supply out of range protection.

The status information regarding whether the IGBT is turning on or off enables the logic card that hosts the processor controller 302 to perform an interlocking between an upper and lower IGBT, preventing issuance of an ON command to a device that its compliment is not turned OFF, or its load has failed. Thus, the IGBTs are prevented from turning ON in a short circuit condition.

The status information relating to whether the gate drive 308 has performed an out-of-saturation protection operation or a low voltage power supply out of range protection operation may be used by the logic card to indicate that the IGBTs have been turned OFF locally by the gate drive 308. Moreover, this information may signal the logic cart to issue OFF commands for the IGBTs. Depending on the fault information, the controller will follow the appropriate procedure to recover the operation.

Figure 4:
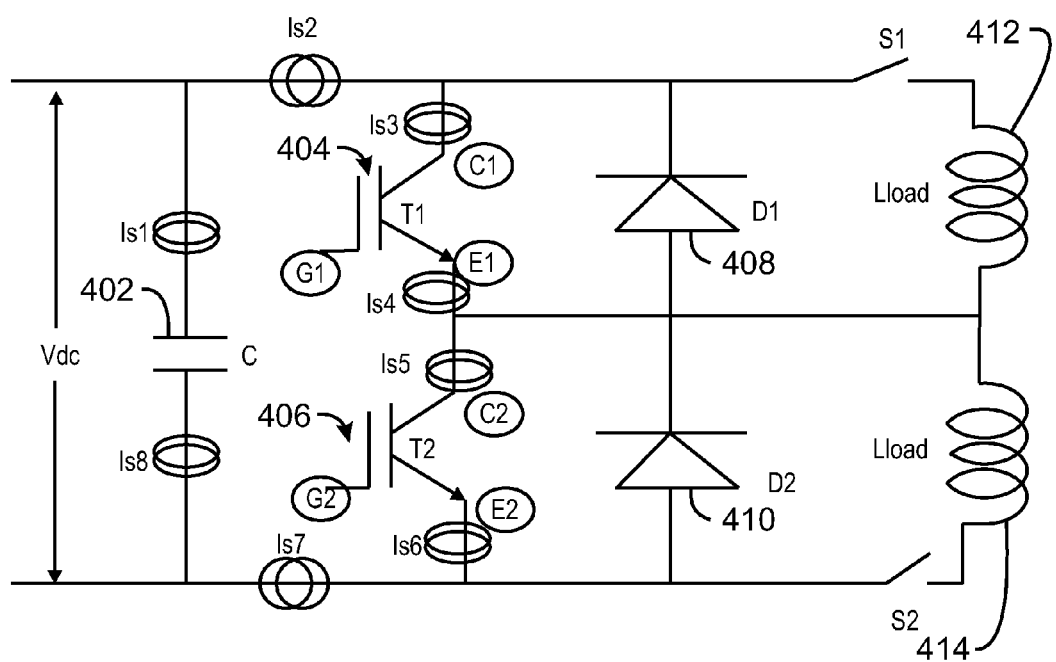
FIG. 4 is a schematic diagram of an IGBT circuit 400 according to an exemplary embodiment.

FIG. 4 is a schematic diagram of an IGBT circuit 400 according to an exemplary embodiment. The IGBT circuit 400 includes a capacitor 402 that provides a voltage Vdc across an IGBT T1 404 and an IGBT T2 406. A diode D1 408 is connected across the output of the IGBT T1 404 and a diode D2 410 is connected across the output of the IGBT T2 410. A load 412 is connected across the diode D1 408 and a load 414 is connected across the diode D2 410.

As indicated herein, an exemplary embodiment provides identification of out-of-saturation conditions and protection when such events occur. In normal operation of an IGBT in an inverter or an H bridge configuration, consider the operation of one leg or phase. For purposes of illustration, assume that the IGBT T1 404 is OFF and that, subsequently, the IGBT T2 406 is turned OFF. At this point, the switch S1 is closed and the switch s2 is open. The position of the switches S1 and S2 is dictated by the status of the IGBTs of the other two phases. The load current is freewheeling in the loop Lload>diode D1 408>switch S1.

Figure 5:
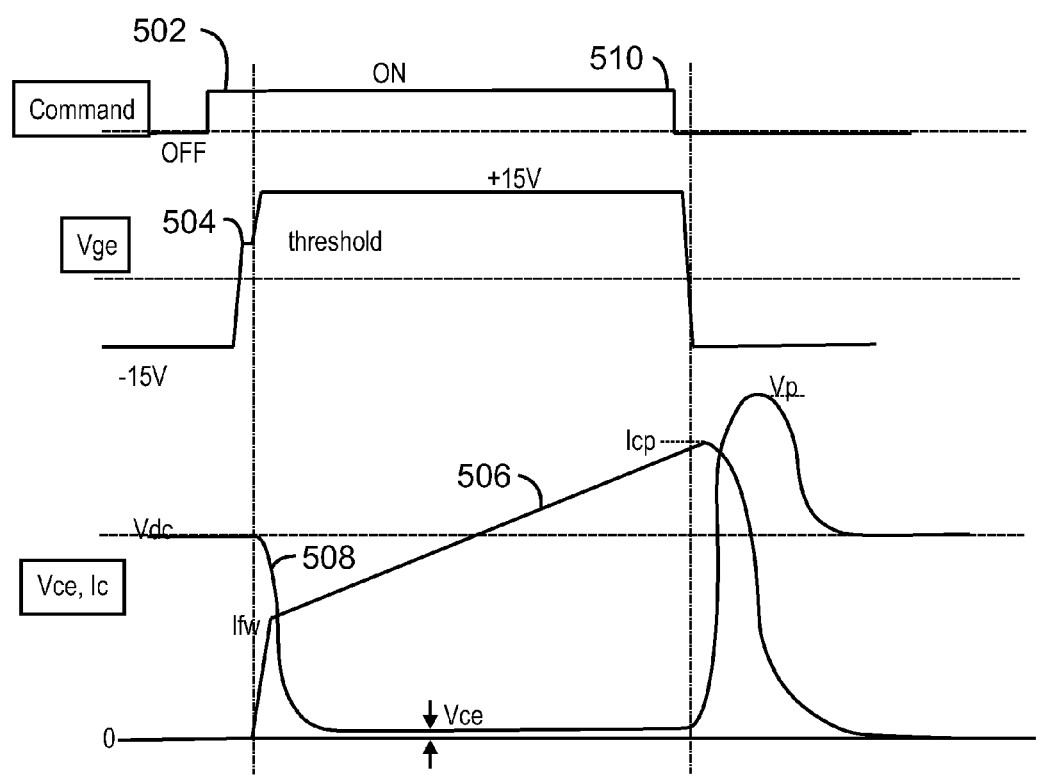
FIG. 5 is a graph that is useful in explaining the operation of the IGBT circuit shown in FIG. 4.

FIG. 5 is a graph 500 that is useful in explaining the operation of the IGBT circuit 400 shown in FIG. 4. The graph 500 includes a command trace 502 and a Vge trace 504. In addition, the graph 500 includes an Ic trace 506 and a Vce trace 508.

In an exemplary embodiment, the gate drive 308 applies a negative Vge bias, and may apply positive voltage at the gate-to-emitter terminals of the IGBT T1 404. The IGBT T1 T1 404 takes over the current from the freewheel loop (indicated at Ifw in FIG. 5) and applies it to the bottom Lload of FIG. 4. Thereafter, the Ic is increasing with a rate:

$$dIc(t)/dt = Vdc/L1$$

where

L1=Sum of: internal 1 of capacitor(lc), ls1+ls2+ls3+ls4+Lload+ls6+ls7+ls8 which, because lc+ls1+ls2+ls3+ls4+ls6+ls7+ls8<<<Lload, L1 approximately equals to Lload. The current, assuming a hard Vdc supply, will continue to increase with this rate until the IGBT T1 404 is turned OFF, as shown at a point 510 on the command trace 502.

When T1 is commanded OFF (point 510), the date drive reverses rapidly the Vge thus applying -ve bias to the IGBT T1 404. At this point, the switch S1 is still open and S2 is closed. The voltage across Vce starts recovering and the Ic(t) current is switching OFF with a fast rate, depending on the speed of the IGBT and the stray inductance of the circuit. The current through the IGBT T2 406 is diverted to the freewheeling loop Lload→D2→S2, keeping the load current relatively constant.

The rapid reduction of Ic(t) through the IGBT T1 404, causes a voltage overshoot with peak Vp across its C→E terminal, before it recovers to Vdc.

$$Vp = -(dIc(t)/dt)*Lo$$

Where Lo=lc+ls1+ls2+ls3+ls4+ls5+ls6+ls7+ls8

Figure 6:
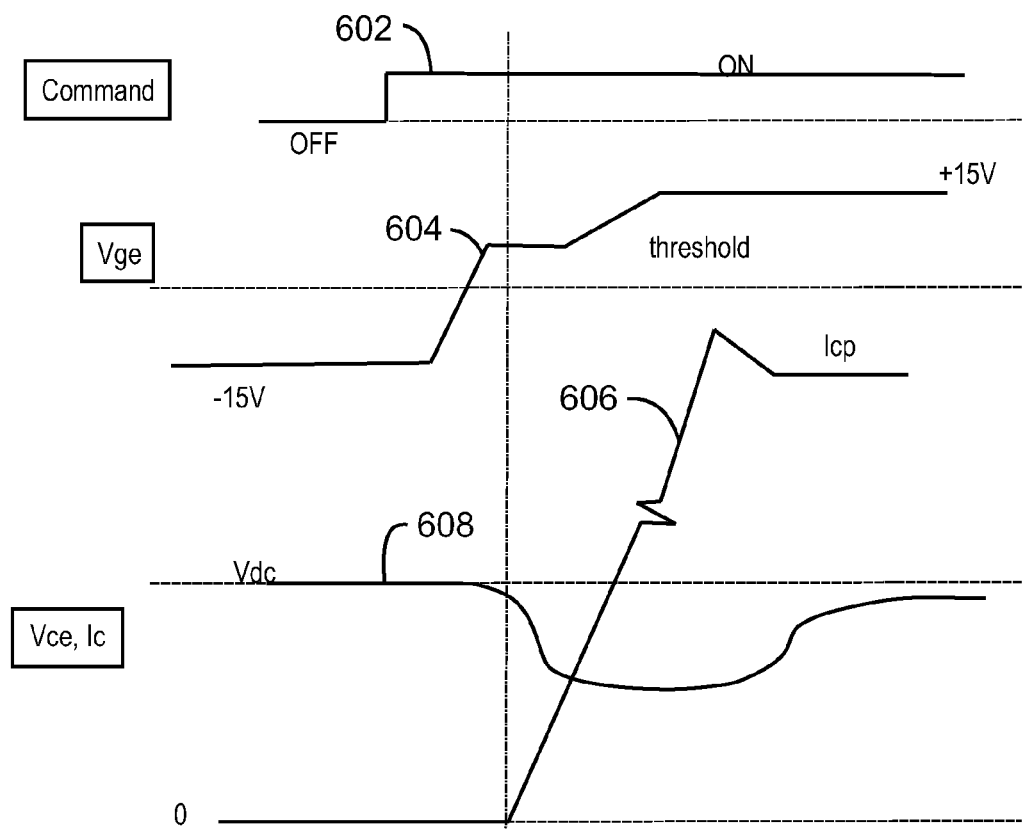
FIG. 6 is a graph 600 that is useful in explaining an out-of-saturation condition.

FIG. 6 is a graph 600 that is useful in explaining an out-of-saturation condition. The graph 600 includes a command trace 602 and a Vge trace 604. In addition, the graph 600 includes an Ic trace 606 and a Vce trace 608.

As explained herein, an IGBT is operating out-of-saturation when it is turned ON in a short circuit or a short circuit occurs while the device is ON. This can happen if:
1. Its complement IGBT in the same phase, or its diode, is short-circuited. This can happen either because the complement IGBT is destroyed, or because, due a malfunction of the control, both IGBTs were commanded ON, or because of noise resulting to the complement IGBT to be ON.
2. There is a short circuit created by grounds.
3. The load presents a short-circuit.

In all these out-of-saturation cases, the current through the IGBT will increase rapidly (as shown by the rapidly increasing Ic trace 606 in FIG. 6), not flowing through the load anymore, with a rate:

$$(dIc(t)/dt) = Vdc/Lo$$

If Lo is of the order of 100 nH, the rate of rise of the fault current is very high. With this rapid rate, Ic(t) exceeds the rated peak current of the IGBT in fraction of a microsecond, and the device is operating "out-of-saturation."

Typically, IGBTs are manufactured with two specifications:
1. The level that the IGBT can restrict Icp for short time, without sustaining any damage. This is typically six to seven times the peak rated current of the device.
2. The short duration that the IGBT can conduct this extremely high current without sustaining any damage. This typically was 10 usec, but recently it is extended by some manufactures towards 20 usec.

Another characteristic of the out-of-saturation operation is relevant. Although, in the beginning, the voltage across the device starts being reduced towards the saturation level (Vce_sat of a few volts), as the IGBT is turning ON, the device recovers its voltage blocking capability (out-of-saturation).

Figure 7:
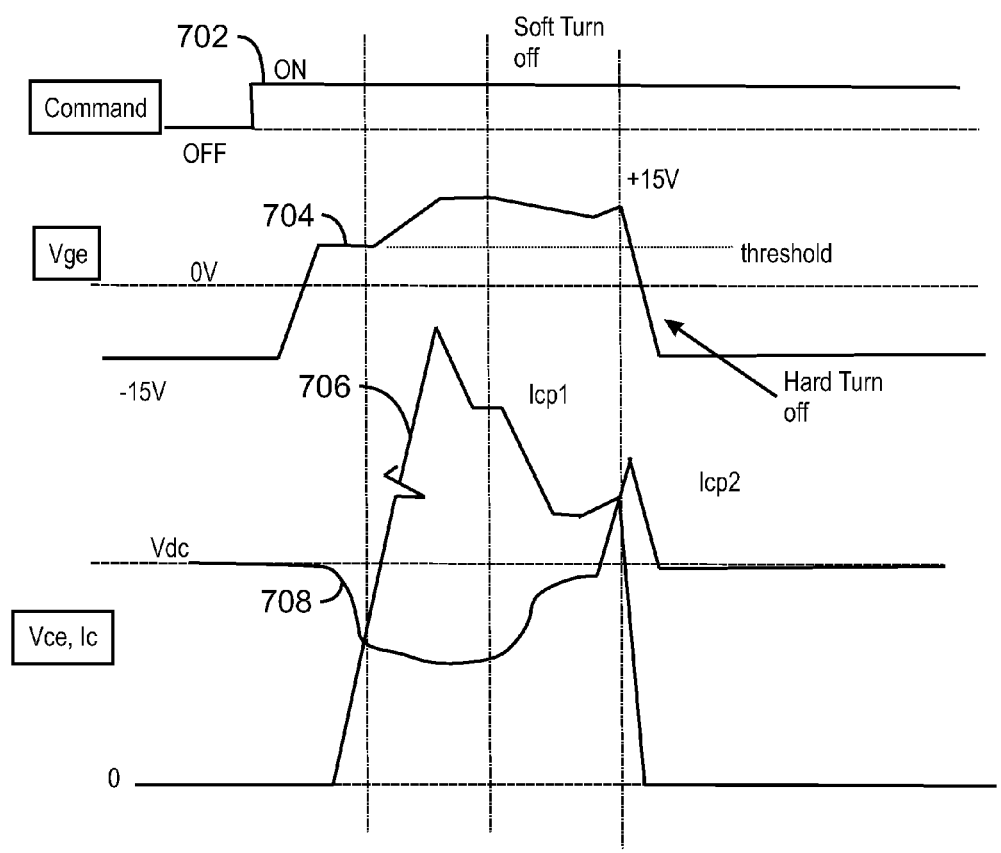
FIG. 7 is a graph that is useful in explaining a potential response to an out-of-saturation condition.

FIG. 7 is a graph 700 that is useful in explaining a potential response to an out-of-saturation condition. Moreover, the graph 700 shows the effect of a process known as a "soft turn-off." The graph 700 includes a command trace 702 and a Vge trace 704. In addition, the graph 700 includes an Ic trace 706 and a Vice trace 708.

The term soft turn-off indicates that the gate drive performs a more gentle or gradual reduction of the short-circuit current, than a hard turn-off, and therefore limits the voltage overshoot (proportional to di/dt). In a soft turn-off, a very large resistance may be placed in series with Rg, and the rate of reduction of the current is very slow. If the device restricts the short circuit current to Icp1 (FIG. 7), during the "soft switching off", Icp1 will only decline to Icp2 (FIG. 7). Also, in the last part of the soft turn-off Vge increases causing Ic also to increase. If the timing is not such that Icp2 remains lower than the rating of the device, the device will be destroyed during the "hard turn-off." In an embodiment, "soft turn-off" and "hard turn-off" are relative to one another, with the former referring to a more gradual or gentle turn off than the latter, e.g., a soft turn-off may involve a more gentle or gradual reduction of the short-circuit current than a hard turn-off, which involves a more abrupt or steep reduction of the short-circuit current than the soft turn-off.

Exemplary embodiments are adapted to detect out-of-saturation conditions, and to provide protection for IGBT devices by controllably switching them off when an out-of-saturation condition occurs. It is not feasible to detect the out-of-saturation condition and issue a hard (normal) OFF command since Icp is typically several times above the upper specified limit of the device. This would have resulted in a destructive (dIc(t)/dt), which from the equation:

$$Vp = -(dIc(t)/dt)*Lo$$

would fail the IGBT on switching OFF because of a voltage transient. Furthermore, if the IGBT is failed under out-of-saturation fault, there is no limitation on the current through the inverter, except the stray inductance which is of the order of 100 nH. This would result in a potential current of hundreds of kilo-amps. Such a current, even for the short duration, until the IGBT would fail in an open circuit condition, would cause significant damage in the inverter, damaging busbars and the like.

In an exemplary power system application, the negative return of the power circuits employs a "floating" negative return system, which means that the negative return is not connected to the chassis ground. If an insulation breakdown occurs between the inverter circuit and the chassis, it will not result in a short circuit situation. Moreover, a short circuit will occur only if there are two or more insulation breakdowns. However, a ground detection may be employed to identify the instance at which an insulation break down occurs, preventing a situation in which two or more grounding occurrences happen at the same time.

The isolation transformer 310 is used to prevent low tension auxiliary systems (like the battery driven loads), where grounding problems can occur more frequently, to propagate the issue to the power circuits. A short-circuit in the load normally appears gradually and can be detected from the increase of current through the converters. An overcurrent protection system may protect system devices under such a fault. However, as explained herein, there are occasions in which an IGBT is turning ON (or is currently ON) and experiences a "dead short" load condition. Such an occurrence forces the IGBT to operate "out-of-saturation." Exemplary embodiments provide identification of the out-of-saturation condition and facilitate the actions taken by the gate drive 308 to controllably switch OFF the affected IGBT and protect it from the large energy associated with the fault.

The gate drive 308, after switching OFF and protecting the IGBT in danger, informs the processor controller 302 via the fiber-optic link, that a fault has occurred. In response, the processor controller 302 issues an OFF command to the remaining IGBTs in that converter and checks that the devices have been turned OFF, via status fiber-optic feedback. If the fault occurred because of a failed IGBT, then its status feedback indicates that this particular device "failed to turn off." Otherwise, after a period to prevent overheating of the junction of the IGBT, the processor controller 302 resets the fault and continues the operation of the converter.

Two variables related to IGBT operation are altered when the IGBT is operating in an out-of-saturation condition. The first variable is that Ic reaches abnormally high levels of six to seven times the rated current. The second variable is that Vce is not reduced to the low Vce sat level (few volts) but remains near the Vdc applied to the link capacitor 402.

Figure 8:
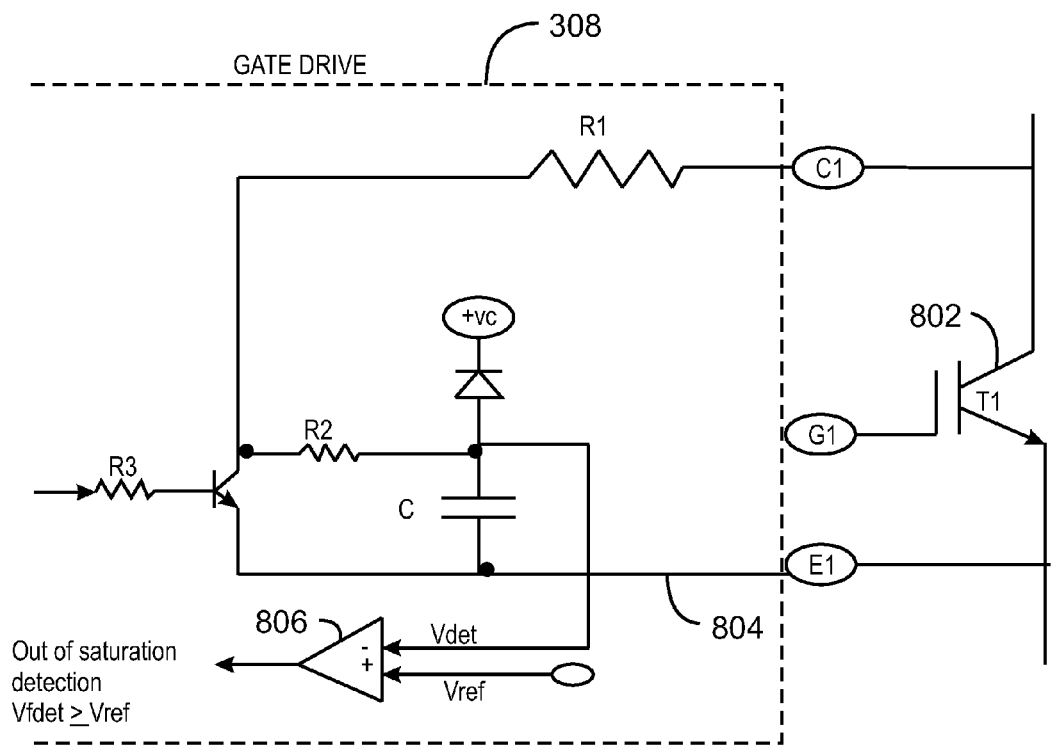
FIG. 8 is a schematic diagram of a circuit that detects an out-of-saturation condition according to an exemplary embodiment.

FIG. 8 is a schematic diagram of a circuit 800 that detects an out-of-saturation condition according to an exemplary embodiment. The circuit 800 shows a portion of the gate drive 308 that includes an IGBT T1 802. A ground plane 804 of the gate drive 308 is connected to the emitter potential of the IGBT T1 802. The collector voltage, after entering the gate drive 308, may be attenuated by a large R1 resistance (2 MOhm). This signal is processed as shown in FIG. 8 and enters a comparator 806. If the device is ON and Vce>Vref, then an out-of-saturation condition is identified.

Figure 9:
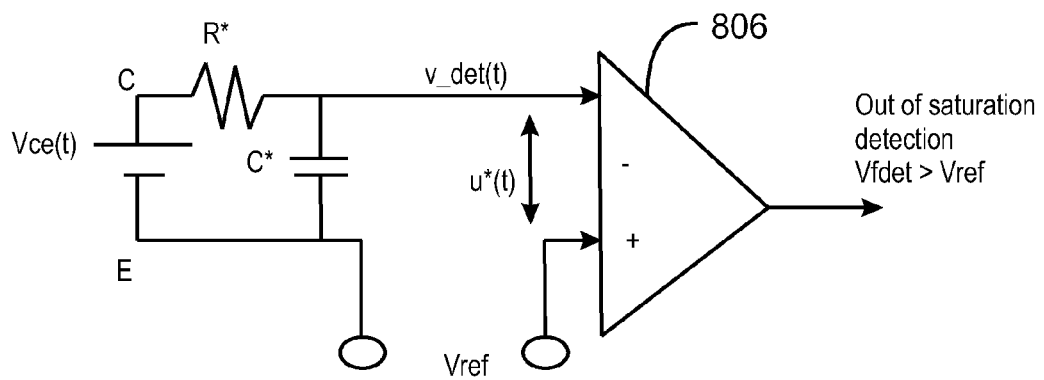
FIG. 9 is a comparator circuit that detects out-of-saturation conditions according to the present techniques.

FIG. 9 is a comparator circuit 900 that detects out-of-saturation conditions according to the present techniques. The comparator circuit 900 shows an embodiment of the comparator 806 shown in the circuit 800 (FIG. 8).

The voltage reaching the out-of-saturation detection comparator 806 of the gate drive(v_det(t)) is not simply an attenuated version of the Vce(t). It is delayed by a time depending on R* and C*, where R* is approximately equal to R1 and C* is the sum of C and stray capacitance of the case. In the event that the device is turning ON, Vce(t) will drop under normal conditions from Vdc. In particular, Vdc drops to Vce_sat, which is a few volts, and negligible in comparison to Vdc. Then:

$$V\text{det}(t)=[Vdc]*[1-\text{EXP}(-t/(R^{**}C^*))]$$

It may be useful to know how long will it take the Vdet(t) to reach, under normal conditions, Vref, which is referred to herein as To. By substituting Vdet with Vref and t with To and solving for To:

$$\text{To}=(R^{**}C^*)*\{-\ln[1-V\text{ref}/(Vdc)]\} \qquad \text{(Equation 1)}$$

Figure 10:
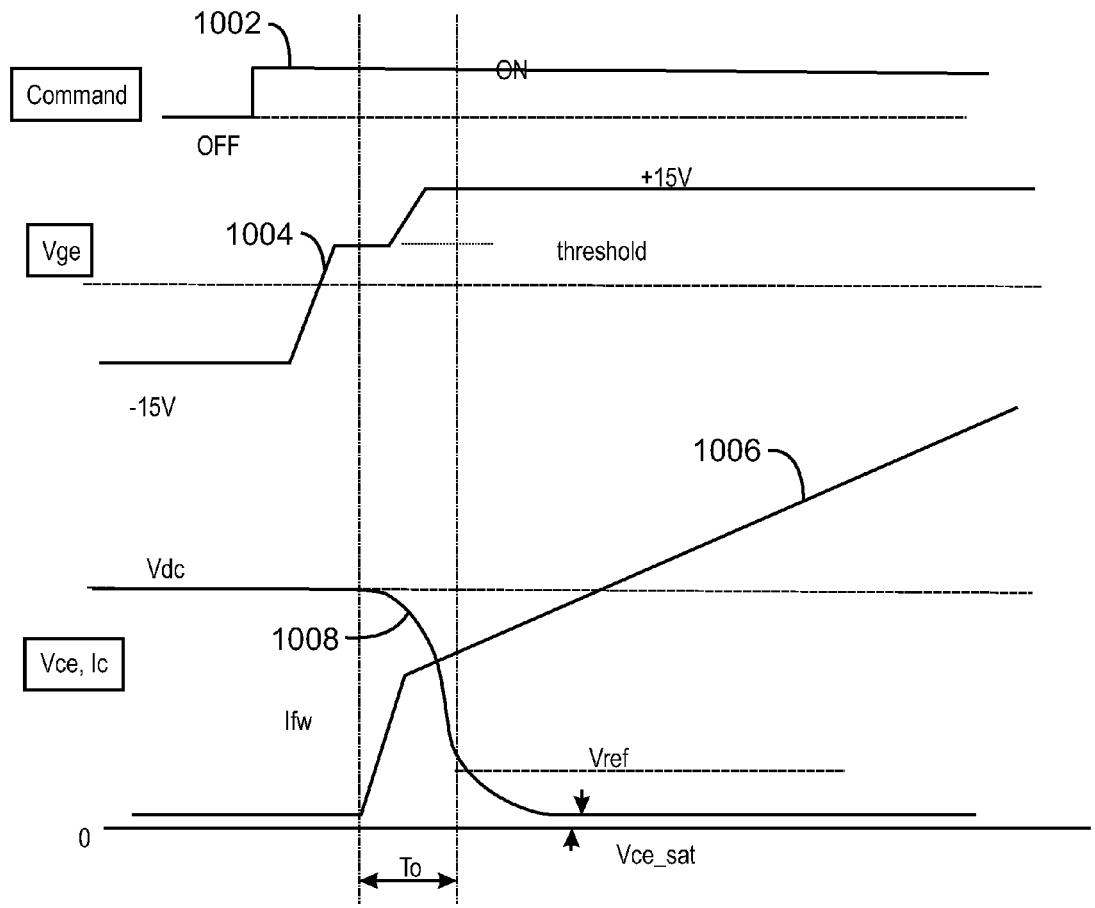
FIG. 10 is a graph useful in explaining the operation of a comparator circuit to detect an out-of-saturation condition according to an exemplary embodiment.

FIG. 10 is a graph 1000 useful in explaining the operation of a comparator circuit to detect an out-of-saturation condition according to an exemplary embodiment. The graph 1000 includes a command trace 1002 and a Vge trace 1004. In addition, the graph 1000 includes an Ic trace 1006 and a Vce trace 1008.

Under normal conditions, To time after the Vge reaches the "threshold" voltage (typically ~8V) and the device starts switching ON, the Vdet is still >=Vref. Thus, after the Vge=>threshold, it is desirable to wait To time before examining whether Vdet>Vref, identifying an out-of-saturation operation.

It is desirable for Vref to be several times higher than the larger Vce_sat of the devices that the gate drive 308 will be used to gate. Additionally, Vref should be several times lower than any Vdc at which the devices will be operated. In one embodiment, Vref may be chosen to be 12.5 volts. In a further embodiment, the value of C on the board is 15 pF, so C* would be 30 uF to include case and stray capacitance.

From Equation 1, it may be seen that "To" depends upon R*, C* and the link voltage Vdc. Accordingly, the higher the Vdc is, the lower the "To". Typical values are:

To (1800V)=0.5 μsec which is good since the short-circuit power is high.

To (150V)=5.96 μsec which is also good since the power is considerably lower.

Figure 11:
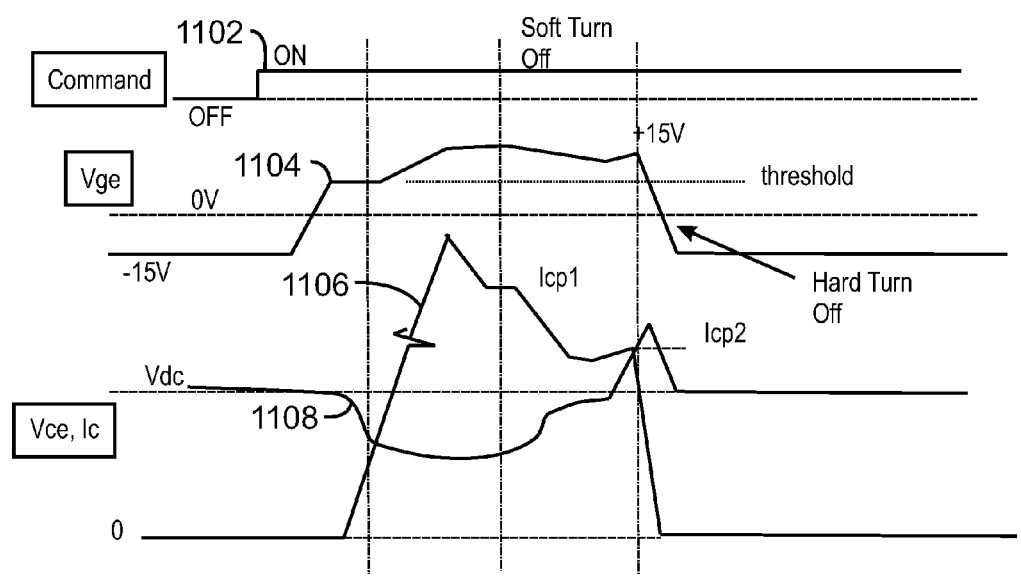
FIG. 11 is a graph useful in explaining the performance of a soft turn-off in response to the detection of an out-of-saturation condition according to an embodiment.

FIG. 11 is a graph 1100 useful in explaining the performance of a soft turn-off in response to the detection of an out-of-saturation condition according to an embodiment. The graph 1100 includes a command trace 1102 and a Vge trace 1104. In addition, the graph 1100 includes an Ic trace 1106 and a Vce trace 1108.

A soft turn-off according to an embodiment may be initially performed when an out-of-saturation condition is identified. In such a soft turn-off, Vge may be reduced from a level of about +15 volts to a level just above the threshold voltage (~8 volts) for about 2.5 microseconds (μsec). In so doing, the high short circuit current may be reduced down to zero. This timing depends upon the rating of the device used. Next, a hard turn-off may be performed to apply reverse bias across the g-e of the IGBT, to keep it OFF and therefore protect it. Reduction of Vge from +15V to about +8V, calls for only a small (for example, the same order of magnitude as Rg_on) to be inserted in series with the normal Rg_on.

The reduction of Vge to just above the threshold voltage causes the short circuit current to be completely switched off during the soft turn-off action. Therefore, during the hard turn-off action, when Vge may be reduced to –15V, there is no current is left to be switched off. Therefore, no –di/dt occurs and there is no second voltage overshoot.

Figure 12:
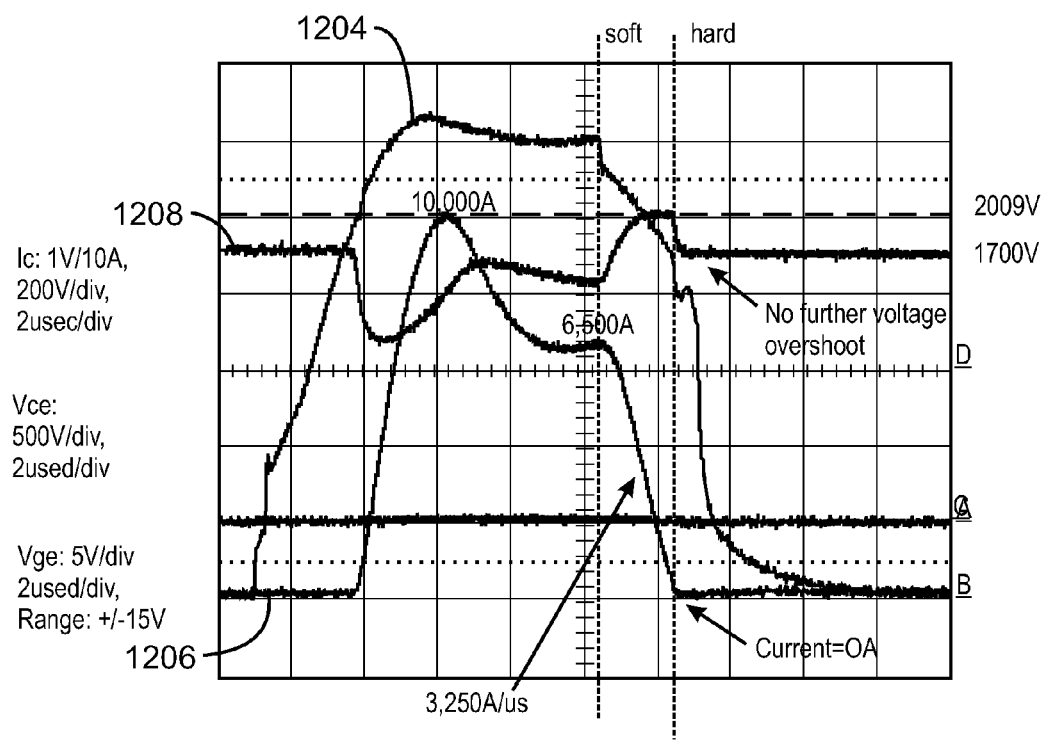
FIG. 12 is a graph useful in explaining the protection of an IGBT device after an occurrence of an out-of-saturation event according to an embodiment of the present techniques.

FIG. 12 is a graph 1200 that is useful in explaining the protection of an IGBT device after an occurrence of an out-of-saturation event according to an embodiment of the present techniques. The graph 1200 includes a Vge trace 1204, an Ic trace 1206 and a Vice 1208.

As shown in the graph 1200, the voltage switching off overshoot=95 nH*3250 A/usec=309V, and occurs during the initial soft turn-off. Vpeak during switching OFF is equal to 1700V+309V=2009V, and occurs during soft turn-off.

Figure 13:
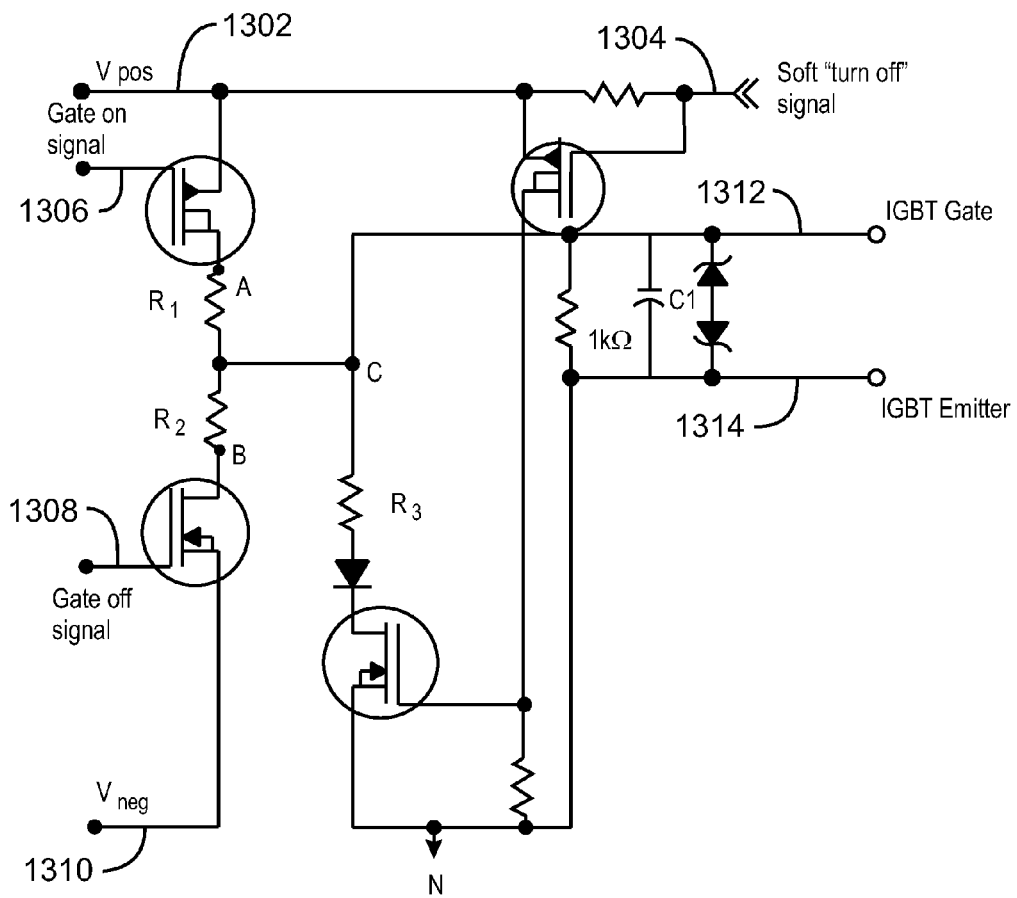
FIG. 13 is a schematic diagram of an IGBT control circuit according to an embodiment.

FIG. 13 is a schematic diagram of an IGBT control circuit 1300 according to an embodiment. The IGBT control circuit 1300 includes a Vpos input 1302, a soft "turn off" signal input 1304, a gate on signal input 1306, a gate off signal input 1308, a Vneg input 1310, an IGBT gate 1312 and an IGBT emitter 1314. In the IGBT control circuit 1300, an extra resistance (R3) may be inserted in series with the Rg_on (R1) for operating the soft turn-off and, after ~2.5 μsec, removing both of these resistances and inserting Rg_off (R2), by gating a FET. It should be noted that the 2.5 μsec duration that the gate drive stays in the soft turn-off action depends on the power rating of the device.

In an embodiment, the occurrence of an out-of-saturation event may be reported to the processor controller 302 on a logic card located external to the power system that contains the IGBT devices. As set forth herein, this communication may take place over a fiber-optic communication link. In one embodiment, two independent communication links are provided: one link for commands and the other link for status information. The command communication link may allow the transmission of "marked-up" command signals from logic cards to gate drives. Information regarding the occurrence of various faults, including out-of-saturation events, may be communicated to the processor controller 302 from the gate drive 308 via the status communication link. As explained herein, the status information transmitted via the status communication link may include whether IGBT devices are on or off, or whether the IGBT devices are transitioning from on to off, or vice versa. Thus, when operational conditions are normal, the command and status signals for the same IGBT would be minor images of each other.

In an embodiment, a command signal to turn on an IGBT is represented by a light that is ON and a command signal to turn off an IGBT is represented by a light that is OFF. In one embodiment, a status signal indicating that an IGBT is on is indicated by a light that is OFF and a status signal indicating that the IGBT is off is indicated by a light that is ON.

By way of example, the processor controller 302 may transmit commands to each individual IGBT at specific intervals (for example, every 2 μsec). In addition, the processor controller 302 may receive feedback for each of the IGBTs at specific intervals (for example, every 2 μsec). The feedback information may be used by a control device (foe example, an FPGA controller) to prevent administering an ON pulse to an IGBT while its complement is still ON. In addition, the fiber-optic communication system may employ an interlock on the command communication link to prevent, through hardware, the transmitting of an ON pulse to an IGBT while its complement is also commanded ON.

The following discussion relates to the various status conditions IGBTs may transmit to the processor controller 302. One status condition that may be transmitted is when an IGBT is turning on. When the gate drive 308 receives, via the fiber-optic command communication link, a command to turn ON, the gate drive 308 will go through a filtering period referred to herein as T1. In an embodiment, T1 starts when the gate drive 308 receives a high logic signal, (for example, when the fiber-optic receiver receives the light intensity of 24 dbm or greater) representing an ON command. The response time T1 may comprise a glitch/noise filtering period of 0.5 μs or higher and also includes gate response. In one example, T1 is between 0.5 μs and 2.5 μs.

After the gate drive 308 receives a valid command (after filtering for glitches) the gate drive 308 may first check that there is no fault (e.g., no out-of-saturation, no power supply failure). Examples of power supply failure include power supply out of range, either high or low. The gate drive 308 may further check whether Vge is less than or equal to −10+/−0.5 volts to determine whether the gate drive 308 and device is firmly in the OFF stage. The gate drive 308 may also check whether a minimum OFF timer is not active. In one example, the minimum OFF, or ON, period is 20.0 μs±14%, except when the soft turn-off protection operation occurs, where minimum ON is not necessarily observed. If any of the checks fails, the gate drive 308 will remain OFF and may generate a fault status (i.e., feedback will be high although the command is high) for as long the inhibiting function remains. If all checks are successful, the gate drive 308 may go through an exemplary switching ON process by firing the gate MOSFET.

Figure 14:
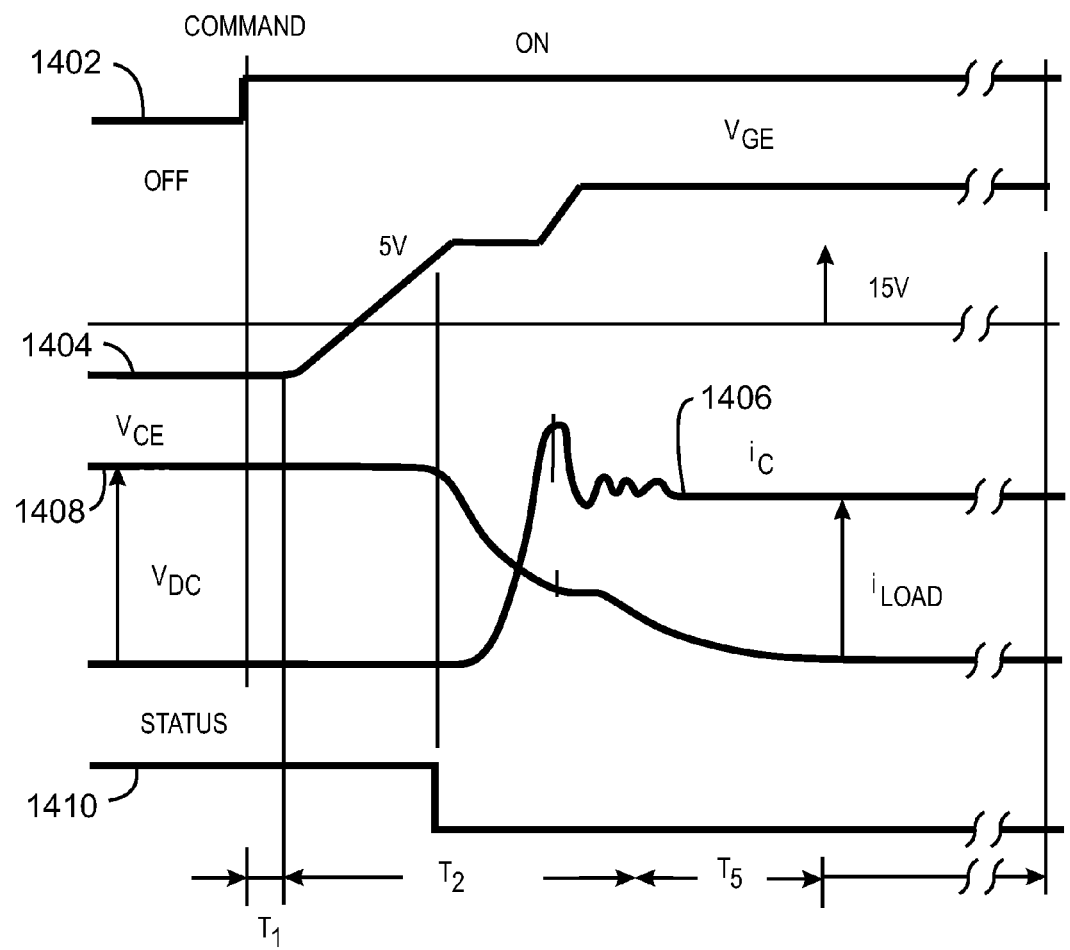
FIG. 14 is a graph that is useful in explaining a process of turning on an IGBT according to an embodiment.

FIG. 14 is a graph 1400 that is useful in explaining the process of turning on an IGBT according to an embodiment. The graph 1400 includes a command trace 1402 and a Vge trace 1404. In addition, the graph 1400 includes an Ic trace 1406 and a Vce trace 1408. The graph 1400 also has a status trace 1410.

T1 ends when the appropriate gate MOSFET is gated. At the end of time T1, the gate voltage starts to rise, the min ON timer (minimum ON=18.3 μs±14%) is started together with the T2 timer (discussed herein). When the gate voltage changes to above 5±0.25 volts, indicating that the output MOSFET is turned ON, the gate drive 308 should change the status signal to low to indicate that the IGBT is turning ON. As described herein, the status feedback offers evidence that the gate drive 308 has acted responsive to a command and not merely an acknowledgement that the gate drive has received the command.

The T2 period allows for the IGBT gate voltage to reach high (for example, >14V) and turn the IGBT ON, before the Vce voltage is monitored to check for out-of-saturation. In one example, T2=8.5 μs±14%.

Figure 15:
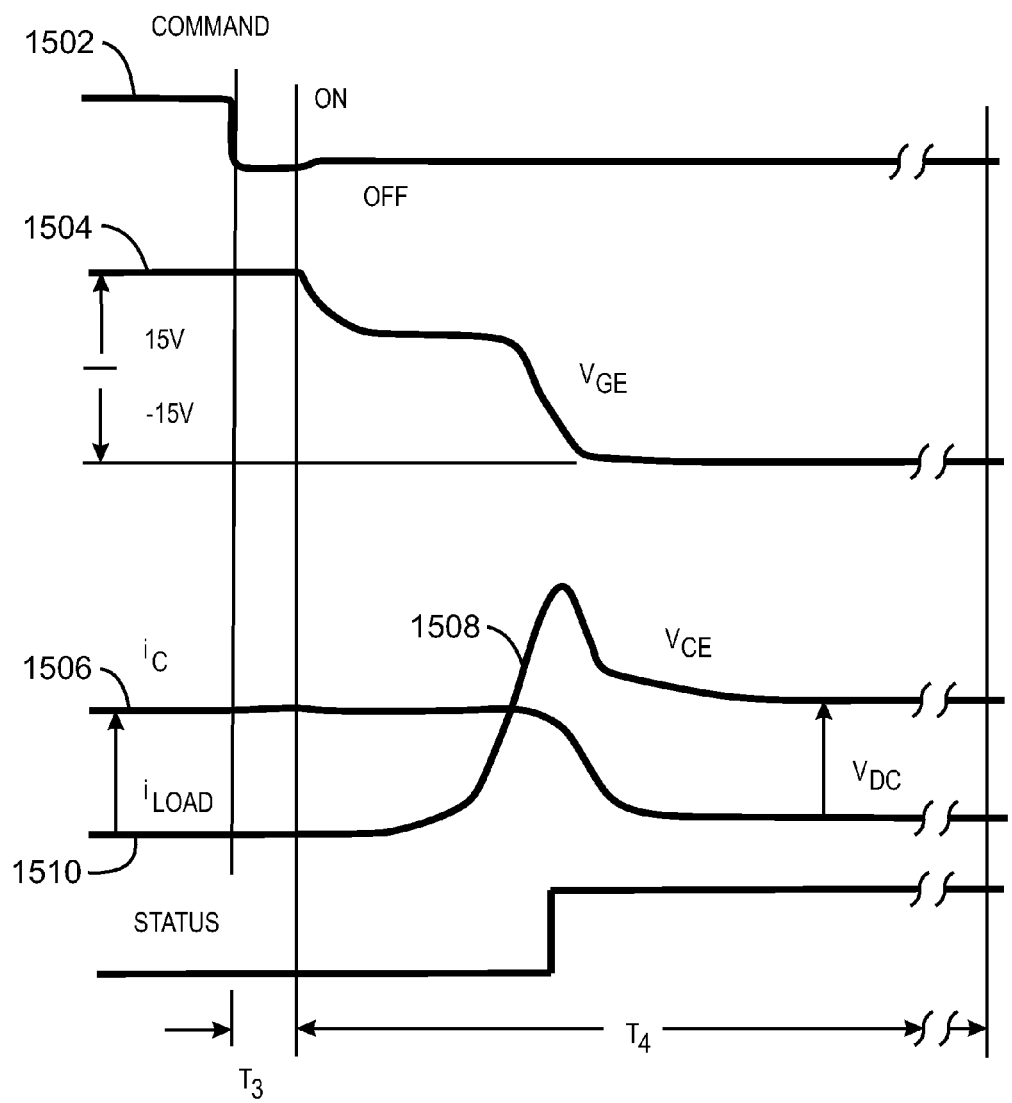
FIG. 15 is a graph that is useful in explaining a process of turning off an IGBT according to an embodiment.

FIG. 15 is a graph 1500 that is useful in explaining the process of turning off an IGBT according to an embodiment. The graph 1500 includes a command trace 1502 and a Vge trace 1504. In addition, the graph 1500 includes an Ic trace 1506 and a Vce trace 1508. The graph 1500 also has a status trace 1510.

The process of turning an IGBT off is another condition for which status information may be sent from the gate drive 308 to the processor controller 302. When a change in command, from ON to OFF, has been received, the gate drive 308 may perform a check to determine whether a fault condition exist. Examples of faults include power supply failure, including power supply out of range. If a power supply fault has occurred, the gate drive should have already performed a protective turn OFF and generated a fault status. The gate drive 308 may also check whether the minimum ON timer is active. If the checks are successful, then the gate drive will go through a specified protection process.

The T3 period shown in FIG. 15 is similar to the T1 period from the turning ON process described with reference to FIG. 14. As such, T3 starts when the gate drive 308 receives a low logic signal (for example, no light), representing an OFF command. The T3 period ends when the appropriate gate MOSFET is gated. The response time T3 is glitch/noise filtering period, which may be 0.5 μsec or higher, and also includes gate response. In one example, T3 is in the range between 0.5 μsec and 2.5 μsec.

At the end of time T3, the gate voltage starts to fall towards the negative bias level, the minimum OFF timer is started together with the T4 timer. The T4 period shown in FIG. 15 allows the IGBT to turn completely OFF. This includes the time from the end of T3, for Vge to reach full negative bias, the time (for example, 5 μs) for the Vce to recover from the switching OFF overshoot 10 us for low link voltages, and the time that the IGBT will take to extinguish the Ic tail current (for example, 5 μs). In one example, T4 is in the range of 20 μsec+/−14%.

When the gate voltage changes to below −10±0.5 volts, indicating that the turning OFF output circuit is activated, the gate drive 308 will change the status signal (shown by the status trace 1510) to high to indicate that the IGBT is turning OFF. As such, the status feedback serves as evidence that the gate drive 308 has acted on the OFF command and not merely an acknowledgment of the gate drive 308 has received the OFF command.

Figure 16:
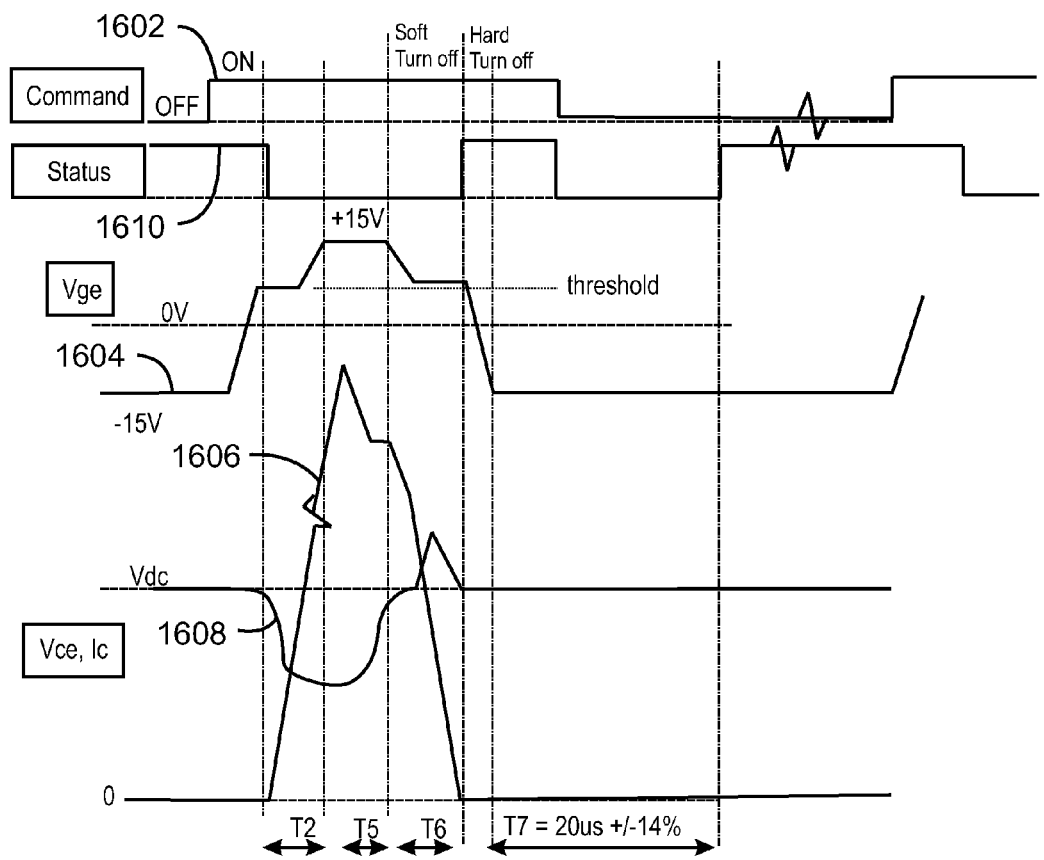
FIG. 16 is a graph that is useful in explaining a process of performing an out-of-saturation protection operation according to an embodiment.

FIG. 16 is a graph 1600 that is useful in explaining a process of performing an out-of-saturation protection operation according to an embodiment. The graph 1600 includes a command trace 1602 and a Vge trace 1604. In addition, the graph 1600 includes an Ic trace 1606 and a Vce trace 1608. The graph 1600 also has a status trace 1610.

When the gate drive 308 detects out-of-saturation condition, the status signal (represented by the status trace 1610) becomes high to indicate fault detection. At the end of a time period T6 (at the start of T7), the gate drive generates the fault status signal for the period T7 (20 μs±14%).

The following discussion relates to the operation of a logic card that hosts the processor controller 302. When the processor controller receives the status indicating fault, it issues an OFF command to all the IGBTs in that converter and checks that the devices have been turned OFF, via status fiber-optic feedback. If the fault occurred because of a failed IGBT, then its status feedback indicates that this particular device "failed to turn off."

In the example shown in FIG. 16, 40 usec after receiving the fault status (well above T7), the processor controller 302 again examines the status signal. If the status is high (although the command is low since the IGBT has been commanded OFF) then the fault was "out-of-saturation," since such a fault would have stopped generating a fault status after T7=20 μsec<40 μsec. Thereafter, the logic card informs the system controller that an out-of-saturation fault has occurred in order to log an out-of-saturation incident and reset the logic card.

In an embodiment, the logic card does not transmit any further ON pulses to the gate drives, even if the system controller has tried to reset it, for a period of 10 seconds. This step is taken to prevent overheating of the junction of the IGBT. After the 10 second period, the main controller, having checked that all IGBTs in this inverter are functional and having been re-set by the system, restarts the operation of the converter.

During the period T6, the gate drive 308 ignores any command signals and returns fault status. During the period T7 the gate drive 308 can either ignore or not ignore the command signal. The gate drive 308 keeps the IGBT off until the command signal goes "OFF" and then "ON" again.

In addition to handling out-of-saturation conditions, an embodiment may also address faults relating to low voltage power supply out of range conditions. In an embodiment, the gate drives are powered by a low voltage power supply. This low voltage power supply operates from the battery voltage (nominal 75V-80V dc) and provides a 200V peak-to-peak output to the gate drive 308 (FIG. 3).

The gate drive 308 receives this voltage and, after the use of the step down isolating transformer 310, uses two independent regulators 312, 314 to set a +15V and a −15V rails. These voltages are provided to the gate-to-emitter terminals of the IGBT, via the switching MOSFETs 316, in order to turn the device ON/OFF.

In an embodiment, the positive level of Vge, provided to the IGBT is greater than 14 volts to assure proper IGBT on-state voltage but also should be below 16.5V to ensure assure short circuit capability at 1800 VDC. This translated to the output of the regulator means that the positive supply voltage should be between 12.5V and 16.5V for operating temperatures between −40° C. and 75° C. If the positive supply voltage provided by the positive regulator 312 is out this range, the gate drive 308 will detect "supply voltage out of range" and, controllably, turns the IGBT off. After the detection, the gate drive 308 provides fault status back to the processor controller 302 (hosted by a logic card) by transmitting a status signal that is the same as the command signal for a period of 200 μsec or the duration of the fault (whichever is the longest). Note that this is contrary to normal operation, in which the command signal and the status signal are the mirror image of each other).

When the logic card receives the fault status, it issues an OFF command to all the IGBTs in that converter and checks that the devices have been turned OFF, via status fiber-optic feedback. If the fault occurred because of a failed IGBT, then its status feedback indicates that this particular device "failed to turn off."

In an embodiment, the logic card differentiates between an out-of-saturation fault and a low voltage power supply out of range fault. By way of example, 40 usec after the logic card received the fault status, it examines the status signal again. If the status is low (the command has been turned low much earlier) then the fault is determined to be a low voltage power supply out of range fault. In this example, the gate drive 308 returns fault status for only 20 μsec in case of out-of-saturation fault.

The logic card may then inform the system controller that a low voltage power supply out of range fault has occurred in order to log a "power supply out of range" incident. The logic card may reset automatically 2.5 seconds after receiving the fault status but it will not transmit any further ON pulses to the gate drives for a further a period of 2.5 seconds or the duration of the fault signal (whichever is the longest) to allow the output capacitors of the gate drive to be re-charged. After the above period, the logic card, having checked that all IGBTs in this inverter are functional, restarts the operation of the converter.

Figure 17:
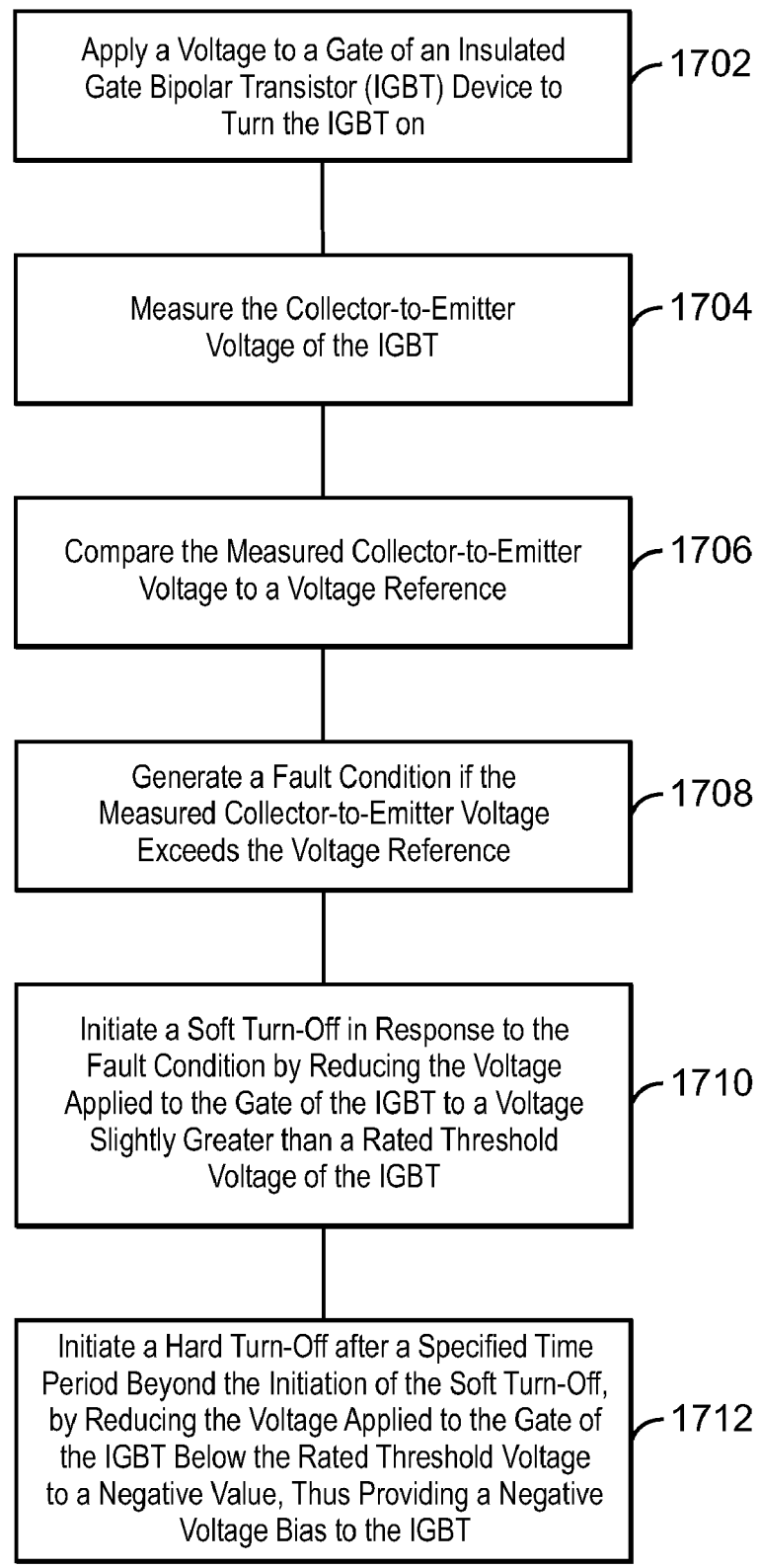
FIG. 17 is a process flow diagram of a method of identifying and addressing an out-of-saturation condition in an IGBT device according to an embodiment.

FIG. 17 is a process flow diagram 1700 of a method of identifying and addressing an out-of-saturation condition in an IGBT device according to an embodiment. At block 1702, a voltage is applied to a gate of an IGBT device to turn the IGBT on. The gate-to-emitter voltage of the IGBT is measured, as shown at block 1704. The measured gate-to-emitter voltage is compared to a voltage reference (block 1706) and a fault condition is generated if the measured gate-to-emitter voltage exceeds the voltage reference (block 1708).

At block 1710, a soft turn-off is initiated in response to the fault condition by reducing the voltage applied to the gate of the IGBT to a voltage slightly greater than a rated threshold voltage of the IGBT. At block 1712, a hard turn-off is initiated after a specified time period beyond the initiation of the soft turn-off, by reducing the voltage applied to the gate of the IGBT below the rated threshold voltage of the IGBT.

Figure 18:
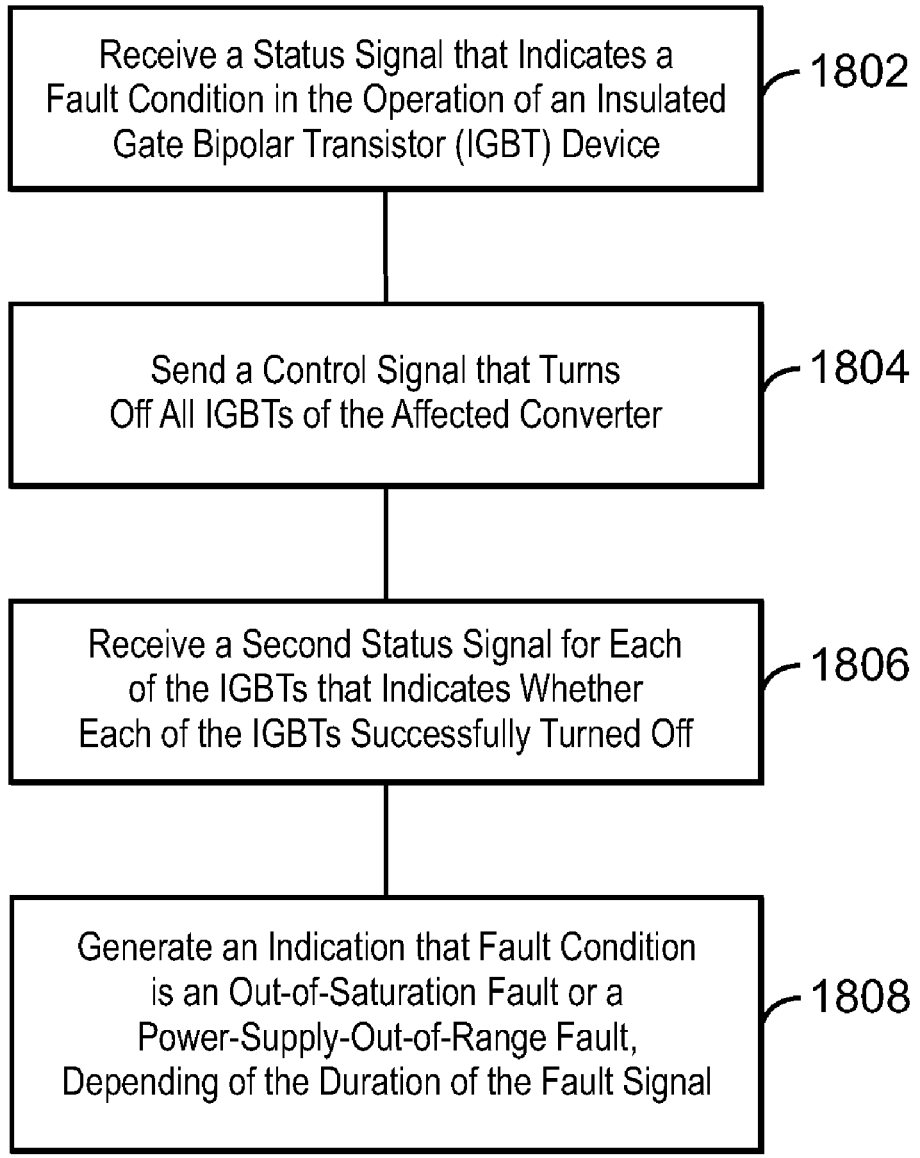
FIG. 18 is a method of determining a type of fault according to an embodiment.

FIG. 18 is a method 1800 of determining a type of fault according to an embodiment. At block 1802, a status signal that indicates a fault condition of an IGBT device is received. A control signal that turns off all IGBTs of the IGBT device is sent, as shown at block 1804. At block 1806, a second status signal is received for each of the IGBTs that indicates whether each of the IGBTs successfully turned off. An indication that the fault condition is an out-of-saturation fault is generated if the second status signal indicates that one or more of the IGBTs has not turned off within a specified time period, as shown at block 1808. Otherwise, an indication that the fault condition is a power-supply-out-of-range fault is generated (block 1808.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to illustrate embodiments of the invention, they are by no means limiting and are exemplary in nature. Other embodiments may be apparent upon reviewing the above description. The scope of the invention should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," "3$^{rd}$," "upper," "lower," "bottom," "top," "up," "down," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described control method, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A control method, comprising:
   receiving a status signal that indicates a fault condition in the operation of an insulated gate bipolar transistor (IGBT) device of an affected converter;
   sending a control signal that turns off all IGBTs of the affected converter;
   receiving a second status signal for each of the IGBTs that indicates whether each of the IGBTs successfully turned off; and
   generating an indication that the fault condition relates to a saturation condition or a power supply being outside a designated range, depending on a duration of the fault signal.

2. The method recited in claim 1, comprising transmitting the status signal from a gate drive to a controller.

3. The method recited in claim 1, wherein the status signal is transmitted via an optical communication link and the control signal is transmitted via a separate optical communication link.

4. The method recited in claim 1, wherein the fault condition is indicated if the control signal is the same as the status signal.

5. The method recited in claim 1, comprising performing a reset operation at a specified time after receiving the status signal that indicates the fault condition.

6. The method recited in claim 5, comprising delaying transmission of an ON control signal until a specified time after the reset operation.

7. The method recited in claim 5, comprising delaying transmission of an ON control signal until a specified time after the reset operation or until after the fault condition has ceased, whichever is longer.

8. An inverter system, comprising:
   an insulated gate bipolar transistor (IGBT) of an affected converter; and
   a controller that receives a status signal that indicates a fault condition in the operation of the IGBT of the affected converter, that sends a control signal that turns off all IGBTs of the affected converter, that receives a second status signal that indicates whether all of the IGBTs of the affected converter successfully turned off, and that generates an indication that the fault condition relates to a saturation condition or a power supply being outside a designated range, depending on a duration of the fault signal.

9. The inverter system recited in claim 8, comprising a gate drive associated with each of the IGBTs that transmits the status signal to the controller.

10. The inverter system recited in claim 8, comprising an optical communication link that transmits the status signal and a separate optical communication link that transmits the control signal, situated in an associated gate drive.

11. The inverter system recited in claim 8, wherein the fault condition is indicated if the control signal is the same as the status signal.

12. The inverter system recited in claim 8, wherein the controller performs a reset operation at a specified time after receiving the status signal that indicates the fault condition.

13. The inverter system recited in claim 12, wherein transmission of an ON control signal is delayed until a specified time after the reset operation.

14. The inverter system recited in claim 12, wherein transmission of an ON control signal is delayed until a specified time after the reset operation or until after the fault condition has ceased, whichever is longer.

15. A power system for a vehicle, comprising:
    an insulated gate bipolar transistor (IGBT) converter that comprises a plurality of IGBTs;
    a plurality of electronic devices that are powered by the IGBTs;
    a controller that receives a status signal that indicates a fault condition in the operation of a one of the IGBTs of the IGBT converter, that sends a control signal that turns off all IGBTs of the IGBT converter, that receives a second status signal for each of the IGBTs that indicates whether each of the IGBTs successfully turned off, and that generates an indication that the fault condition relates to a saturation condition or a power supply being outside a designated range, depending on a duration of the fault signal.

16. The power system recited in claim 15, comprising gate drives that transmit the status signals to the controller.

17. The power system recited in claim 15, comprising an optical communication link that transmits the status signal and a separate optical communication link that transmits the control signal.

18. The power system recited in claim 15, wherein the fault condition is indicated if the control signal is the same as the status signal.

19. The power system recited in claim 15, wherein the controller performs a reset operation at a specified time after receiving the status signal that indicates the fault condition.

20. The inverter system recited in claim 19, wherein transmission of an ON control signal is delayed until a specified time after the reset operation.

* * * * *